(12) United States Patent
Illek et al.

(10) Patent No.: US 10,062,320 B2
(45) Date of Patent: Aug. 28, 2018

(54) DISPLAY DEVICE

(75) Inventors: Stefan Illek, Donaustauf (DE); Norwin von Malm, Nittendorf (DE); Tilman Ruegheimer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 641 days.

(21) Appl. No.: 14/110,412

(22) PCT Filed: Mar. 1, 2012

(86) PCT No.: PCT/EP2012/053548
§ 371 (c)(1),
(2), (4) Date: Dec. 10, 2013

(87) PCT Pub. No.: WO2012/136421
PCT Pub. Date: Oct. 11, 2012

(65) Prior Publication Data
US 2014/0085169 A1    Mar. 27, 2014

(30) Foreign Application Priority Data

Apr. 7, 2011 (DE) .................. 10 2011 016 308

(51) Int. Cl.
| | |
|---|---|
| *H01S 3/04* | (2006.01) |
| *G09G 3/3208* | (2016.01) |
| *H01L 25/075* | (2006.01) |
| *G09G 3/32* | (2016.01) |

(52) U.S. Cl.
CPC ............ *G09G 3/3208* (2013.01); *G09G 3/32* (2013.01); *H01L 25/0753* (2013.01)

(58) Field of Classification Search
CPC ............... G06K 9/0002; G06K 9/0004; H01S 5/02272; H01L 25/0753; H01L 27/3258; G02B 6/0021; B82Y 20/00

USPC ............ 313/498; 372/36; 382/124; 349/65; 257/40, 79

See application file for complete search history.

(56) References Cited

U.S. PATENT DOCUMENTS

| | | |
|---|---|---|
| 6,136,127 A | 10/2000 | De Bastiani |
| 7,319,247 B2 | 1/2008 | Bader et al. |
| 8,796,115 B2 | 8/2014 | Sorg et al. |

(Continued)

FOREIGN PATENT DOCUMENTS

| | | |
|---|---|---|
| CN | 1295350 A | 5/2001 |
| CN | 1439176 A | 8/2003 |

(Continued)

OTHER PUBLICATIONS

Zhou, J.L., et al., "Monolithic LED Microdisplay on Active Matrix Substrate Using Flip-Chip Technology," IEEE Journal of Selected Topics in Quantum Electronics, vol. 15, No. 4, Jul.-Aug. 2009, pp. 1-5.

*Primary Examiner* — Abdul-Samad A Adediran
(74) *Attorney, Agent, or Firm* — Slater Matsil, LLP

(57) ABSTRACT

A display device includes a multiplicity of pixels, at least one connection carrier, and a multiplicity of inorganic light-emitting diode chips. The connection carrier includes a multiplicity of switches. Each pixel contains at least one light-emitting diode chip. Each light-emitting diode chip is mechanically fixed and electrically connected to the connection carrier. Each switch is designed for driving at least one light-emitting diode chip and the light-emitting diode chips are imaging elements of the display device.

17 Claims, 2 Drawing Sheets

(56) References Cited

U.S. PATENT DOCUMENTS

| | | |
|---|---|---|
| 2003/0222334 A1 | 12/2003 | Ikeda et al. |
| 2004/0150660 A1 | 8/2004 | Abe et al. |
| 2004/0208210 A1* | 10/2004 | Inoguchi ............ H01L 25/0753 372/36 |
| 2004/0252867 A1* | 12/2004 | Lan .................... G06K 9/0004 382/124 |
| 2006/0108916 A1 | 5/2006 | Koo et al. |
| 2006/0139261 A1 | 6/2006 | Choi et al. |
| 2006/0170336 A1 | 8/2006 | Ono et al. |
| 2006/0237133 A1 | 10/2006 | Akamatsu et al. |
| 2006/0256255 A1* | 11/2006 | Minami ............... G02B 6/0021 349/65 |
| 2007/0024544 A1 | 2/2007 | Chung et al. |
| 2007/0164275 A1* | 7/2007 | Ishiguro ............. H01L 27/3258 257/40 |
| 2008/0036362 A1* | 2/2008 | Tanimoto ............. H01L 33/486 313/498 |
| 2008/0237611 A1* | 10/2008 | Cok ..................... B82Y 20/00 257/79 |
| 2010/0039357 A1 | 2/2010 | Cok et al. |
| 2011/0037059 A1 | 2/2011 | Gyoda |

FOREIGN PATENT DOCUMENTS

| | | |
|---|---|---|
| CN | 1551060 A | 12/2004 |
| CN | 1862647 A | 11/2006 |
| CN | 101523598 A | 9/2009 |
| DE | 4130844 A1 | 3/1993 |
| DE | 102010018260 A1 | 8/2011 |
| EP | 0310889 A2 | 4/1989 |
| EP | 1675093 A1 | 6/2006 |
| JP | 5552857 U | 4/1980 |
| JP | 347589 U | 5/1991 |
| JP | 1055155 A | 2/1998 |
| JP | 2006065011 A | 3/2006 |
| JP | 2006301250 A | 11/2006 |
| JP | 2007199506 A | 8/2007 |
| JP | 2008066454 A | 3/2008 |
| JP | 2009088190 A | 4/2009 |
| JP | 2010039090 A | 2/2010 |
| TW | 595276 B | 6/2004 |
| TW | I220882 B | 9/2004 |
| TW | 201030698 A | 8/2010 |
| WO | 9724770 A1 | 7/1997 |
| WO | 9819290 A1 | 5/1998 |
| WO | 03069593 A2 | 8/2003 |
| WO | 2008040315 A2 | 4/2008 |

* cited by examiner

DISPLAY DEVICE

This patent application is a national phase filing under section 371 of PCT/EP2012/053548, filed Mar. 1, 2012, which claims the priority of German patent application 10 2011 016 308.5, filed Apr. 7, 2011, each of which is incorporated herein by reference in its entirety.

TECHNICAL FIELD

A display device is specified.

SUMMARY OF THE INVENTION

Embodiments of the invention specify a display device that enables image generation with high contrast values and fast switching times.

In accordance with at least one embodiment of the display device, the display device comprises a multiplicity of pixels. The image to be generated is composed of the pixels of the display device. The pixels are arranged for example in a matrix-like fashion in lines and columns. Each pixel can be suitable for example for representing three colors, such as red, green and blue, for instance. The colors are generated as light by imaging elements of the display device.

In accordance with at least one embodiment of the display device, the display device comprises at least one connection carrier. The display device can comprise a plurality of connection carriers, for example, which are arranged adjacent to one another. Furthermore, it is possible for the display device to comprise a single connection carrier. The connection carrier serves as a mechanical carrier for the imaging elements of the display device. It can be embodied in a rigid or flexible fashion. Furthermore, the connection carrier also serves for electrical contact-connection and for driving of the imaging elements. In this case, it is possible for the connection carrier to be embodied as radiation-transmissive, transparent or radiation-nontransmissive, for example radiation-absorbent and/or radiation-reflecting.

In accordance with at least one embodiment of the display device, the display device comprises a multiplicity of light-emitting diode chips. The light-emitting diode chips are, for example, colored light-emitting diode chips which generate colored light during operation. In this case, the light-emitting diode chips can generate the colored light directly. Furthermore, it is possible for a light-emitting diode chip of the display device to generate UV radiation or blue light which is converted to light having a different color by a converter element assigned to the light-emitting diode chip. In this case, the number of light-emitting diode chips of the display device preferably corresponds at least to the number of pixels of the display device.

In accordance with at least one embodiment of the display device, the connection carrier comprises a multiplicity of switches. In this case, each switch is designed in particular for driving at least one light-emitting diode chip. The switches are, for example, thin-film transistors or CMOS (Complementary Metal Oxide Semiconductor) structures. The switches are arranged for example on a main body of the connection carrier. Each switch is designed to drive at least one light-emitting diode chip. The driving can involve, for example, switching on and/or switching off the light-emitting diode chip to which the switch is assigned. Furthermore, for example, the current intensity with which the light-emitting diode chip is operated can also be set by means of the switch. Each switch makes contact with the n-type side or the p-type side of an assigned light-emitting diode chip.

In accordance with at least one embodiment of the display device, each light-emitting diode chip is mechanically fixed and electrically connected to a connection carrier of the display device. In this case, the light-emitting diode chip is mechanically fixed and electrically connected to the connection carrier in an unpackaged fashion. That is to say that the light-emitting diode chip is applied directly on the connection carrier, without the presence of a housing, for example composed of a plastic or a ceramic material, in which the light-emitting diode chip is arranged. In this case, the light-emitting diode chips form the imaging elements of the display device. That is to say that the display device is in particular free of further imaging elements such as an LCD panel, for example. Rather, the individual light-emitting diode chips directly generate the light of an assigned pixel of the display device.

In accordance with at least one embodiment of the display device, the display device comprises a multiplicity of pixels, at least one connection carrier and a multiplicity of light-emitting diode chips. The connection carrier comprises a multiplicity of switches, wherein each light-emitting diode chip is mechanically fixed and electrically connected to the connection carrier, and each switch is designed for driving at least one light-emitting diode chip. Each pixel of the display device contains at least one light-emitting diode chip, wherein the light-emitting diode chips are the imaging elements of the display device.

A display device described here is distinguished in particular by the fact that it achieves high contrast values as a result of the individual driving of, for example, the brightness of the individual light-emitting diode chips, since a "true" black can be generated in particular by completely switching off a light-emitting diode chip. The omission of a further imaging element such as an LCD panel, for example, allows very high image refresh rates, on account of the particularly fast driving of the light-emitting diode chips as imaging elements. The display device is therefore particularly well suited to three-dimensional representations with the use of shutter glasses. On account of the omission of a housing for the light-emitting diode chips, the individual light-emitting diode chips can be arranged very close to one another on the connection carrier or the connection carriers. By way of example, the distance between adjacent light-emitting diode chips is 10 µm or less. Small displays having high resolutions are possible in this way. Furthermore, the omission of a further imaging element enables a very flat construction of the display device, which enables a very thin display device. Furthermore, the omission of further imaging elements increases the overall efficiency of the display device since absorption losses, for example at polarization filters or the further imaging element itself, are omitted.

The light-emitting diode chips can be in particular light-emitting diode chips which are free of a growth substrate or a carrier substrate. That is to say that the light-emitting diode chips can comprise only epitaxially produced semiconductor layers, contact layers and, if appropriate, a converter layer. This also enables a particularly flat display device which is determined substantially only by the thickness of the connection carrier and the thickness of the light-emitting diode chips. In this case, the light-emitting diode chips are in particular inorganic light-emitting diode chips based, for example, on a III-V compound semiconductor material.

In accordance with at least one embodiment of the display device, each switch is assigned uniquely to a light-emitting diode chip. That is to say that exactly one light-emitting diode chip is present for each switch and exactly one switch is present for each light-emitting diode chip. In this embodiment, therefore, each switch has to drive only a single light-emitting diode chip. This makes it possible to use particularly simple switches that are suitable for energizing the assigned light-emitting diode chip with particularly short switching times.

In accordance with at least one embodiment of the display device, the display device comprises a contact layer, which electrically conductively connects at least two light-emitting diode chips to one another. By way of example, the light-emitting diode chips are electrically conductively connected to an assigned switch at one connection side. At the other connection side, they are electrically conductively connected to one another and thus jointly contact-connected via the common contact layer. In this case, it is possible for a plurality of light-emitting diode chips to be electrically conductively connected to one another via the contact layer. By way of example, a line or a column of light-emitting diode chips can in each case be connected to one another by means of the contact layer. In the extreme case, all light-emitting diode chips can be electrically conductively connected to one another via a single common contact layer. In this case, the contact layer facilitates the contact-connection of the light-emitting diode chips since an individual contact-connection of each chip, for example by means of a contact wire, can be dispensed with in this case.

In accordance with at least one embodiment of the display device, the contact layer is embodied in a radiation-transmissive fashion at least in places. That is to say that the contact layer is at least partly transmissive to the electromagnetic radiation generated by the light-emitting diode chips during operation. In this case, it can be embodied in a transparent and pellucid fashion.

The contact layer can cover at least in places radiation passage areas of the light-emitting diode chips electrically conductively connected to one another by the contact layer. The contact layer can be situated there, for example, in direct contact with a light-emitting diode chip of the display device and impress current into the light-emitting diode chip via the radiation passage area. Furthermore, it is possible for the contact layer to touch the light-emitting diode chip only in places and, at other places, to straddle the radiation passage area without touching the light-emitting diode chip there.

The radiation passage area can be formed for example at that side of the light-emitting diode chips which faces away from the connection carrier. At the side facing the connection carrier, each light-emitting diode chip is then electrically conductively connected to the associated switch, for example applied directly to a contact location of the switch.

In accordance with at least one embodiment of the display device, the contact layer is embodied in a radiation-transmissive fashion at least in places, and the contact layer is formed at least in places with a material that is reflective to electromagnetic radiation generated by the light-emitting diode chips during operation. That is to say that the contact layer is subdivided into different regions in this case. The contact layer comprises radiation-transmissive regions, which are formed for example with an electrically conductive, radiation-transmissive material. Furthermore, the contact layer comprises radiation-reflecting regions, which are formed for example with a reflective metal such as silver or aluminum. In this case, it is possible, in particular, for the reflective regions of the contact layer to be formed between adjacent light-emitting diode chips and/or at the edge of the light-emitting diode chips. The radiation-transmissive region of the contact layer then covers a large part of the radiation passage area. A contact layer embodied in this way also serves for optically decoupling adjacent light-emitting diode chips. That is to say that electromagnetic radiation generated by a light-emitting diode chip during operation can impinge laterally on the reflective region of the contact layer and does not pass into the region of an adjacent light-emitting diode chip. In this way, the individual pixels to which the light-emitting diode chips are assigned can be optically separated from one another particularly well. Furthermore, the reflective regions of the contact layer, if they are formed with a reflective metal, increase the conductivity, in particular the transverse conductivity, of the contact layer, which makes it possible that as many light-emitting diode chips as possible can be electrically contact-connected with the aid of the same contact layer.

In accordance with at least one embodiment of the display device, the contact layer is formed in places with a transparent conductive oxide (TCO). In particular the radiation-transmissive regions of the contact layer can then also consist of such a material.

In accordance with at least one embodiment of the display device, the display device comprises an optical body, which is disposed downstream of at least one portion of the light-emitting diode chips, wherein the electromagnetic radiation generated by the light-emitting diode chips during operation at least partly, in particular for the most part, passes through the optical body, and the electromagnetic radiation is optically expanded upon passing through the optical body. That is to say that the optical body expands the electromagnetic radiation emerging at the radiation passage area of a light-emitting diode chip into a beam having a larger beam cross section. This proves to be particularly advantageous in the case of large-area displays having a screen diagonal of 1 m or more. In the case of such large displays, it proves to be advantageous if not the entire area of a pixel is equipped with one or more light-emitting diode chips. By way of example, the ratio of the edge length of a light-emitting diode chip to the grid of the pixels can be 1:100 or less. However, in order to improve the optical appearance of the image generated by the display device, that is to say to enable as far as possible no separations between individual pixels to be discernible to the viewer, expansion of the electromagnetic radiation generated by a light-emitting diode chip to the size of the assigned pixel proves to be advantageous. This can be achieved by means of the optical body. In this case, it is also possible for a plurality of different-colored light-emitting diode chips, for example red, green and blue light-emitting diode chips, to be arranged within the same expansion region. That is to say that each pixel can comprise a plurality of light-emitting diode chips whose electromagnetic radiation is expanded by the optical body in each case to the size of the assigned pixel.

In accordance with at least one embodiment of the display device, the optical body comprises radiation-nontransmissive separating structures, which optically separate adjacent pixels from one another. The radiation-nontransmissive separating structures ensure that the light from light-emitting diode chips which are assigned to different pixels is not superimposed after passing through the radiation-expanding optical body. By way of example, for this purpose the separating structures are embodied as directionally or diffusely reflective. By way of example, the separating structures can be embodied as cutouts in a main body of the optical body which are metallically coated or are filled with a diffusely reflective material.

In accordance with at least one embodiment of the display device, the optical body comprises scattering structures for scattering the electromagnetic radiation passing through, and the separating structures are formed by diffusely reflective regions. The scattering of the electromagnetic radiation passing through results in expansion of the beam and also homogenization. In this way, a pixel has a particularly homogeneous luminance over its area. The diffusely reflective separating structures then also contribute to such homogenization. In this case, the scattering structures can be formed in the volume of a main body of the optical body, which can be formed with a pellucid material. By way of example, the scattering centers are formed by scattering particles or gas inclusions in the main body. Furthermore, it is possible for the scattering structures to be produced by focused laser radiation in a targeted manner in the material of the main body and to be formed for example by material alteration in the region of the focus of the laser beam.

In accordance with at least one embodiment of the display device, the separating structures are formed by cutouts in the main body of the optical body which are filled with a radiation-scattering material. By way of example, the material comprises at least one of the following materials: $TiO_2$, $Al_2O_3$.

In accordance with at least one embodiment of the display device, the separating structures extend from that side of the main body of the optical body which faces the light-emitting diode chips in the direction of that side of the main body which faces away from the light-emitting diode chips, and do not completely penetrate through the main body. The separating structures are then no longer formed in particular in the vicinity of that side of the optical body which faces away from the light-emitting diode chips. That is to say that a small overlap of the electromagnetic radiation of adjacent pixels can occur in these regions. This has the effect that there are no optical separations between the pixels for the viewer. That is to say that the viewer in the ideal case cannot distinguish individual pixels from one another. The display device is thus embodied in the manner of a so-called retina display. By way of example, the separating structures extend over at most 4/5 of the thickness of the main body.

In accordance with at least one embodiment of the display device, the contact layer at least in places directly adjoins the light-emitting diode chips which it electrically conductively connects to one another, and the optical body. That is to say that the contact layer is arranged directly between the light-emitting diode chips and the optical body. In this way, the contact layer can impart a mechanical connection between the two elements. Furthermore, via the contact layer, heat generated by the light-emitting diode chips during operation can be transferred to the optical body, which then also serves as a heat sink for the covered light-emitting diode chips. By means of the described division of the contact layer into radiation-transmissive and radiation-reflecting regions, it is furthermore possible to achieve or support an optical separation between adjacent pixels before the electromagnetic radiation actually enters into the optical body.

BRIEF DESCRIPTION OF THE DRAWINGS

The display device described here is explained in greater detail below on the basis of exemplary embodiments and the associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford better understanding.

DETAILED DESCRIPTION OF ILLUSTRATIVE EMBODIMENTS

Figure 1:
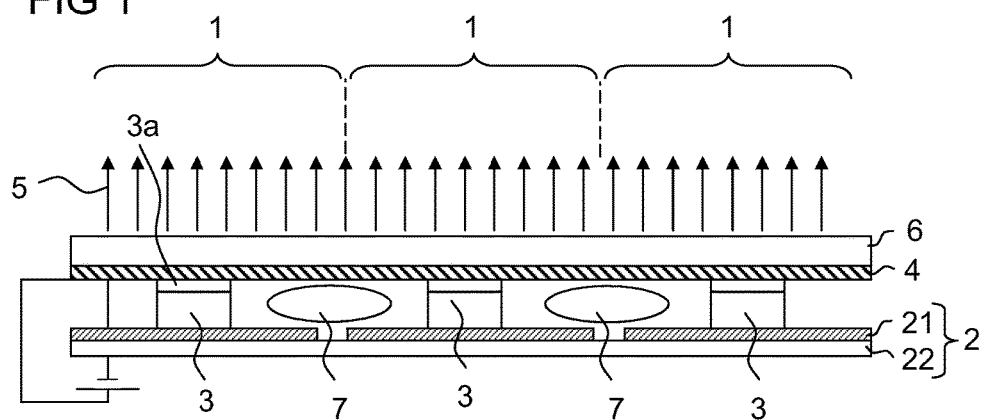
FIGS. 1 and 2 show exemplary embodiments of display devices described here on the basis of schematic sectional illustrations.

A first exemplary embodiment of a display device described here is explained in greater detail with the aid of the schematic sectional illustration in FIG. 1. The display device comprises a multiplicity of pixels 1. The pixels 1 together form the image to be represented by the display device. They are arranged, for example, in rows and columns in the manner of a matrix. In the present case, at least one light-emitting diode chip 3 is assigned to each pixel 1. The light-emitting diode chips 3 are arranged on a connection carrier 2. The connection carrier 2 serves for mechanical fixing and electrical contact-connection and driving of the light-emitting diode chips 3.

The connection carrier 2 comprises switches 21 by means of which the light-emitting diode chips 3 can be individually energized. In this case, the switches 21 are designed for example for switching on, for switching off and for defining the current intensity with which an assigned light-emitting diode chip 3 is energized. By way of example, the switches 21 are thin-film transistors. In this case, the light-emitting diode chips 3 can be in direct contact with connection locations of the switches 21. The main body 22 can be embodied as a printed circuit board, for example, which connects the individual switches 21 to the power supply for the light-emitting diode chips and the switches.

Separating elements 7 can be formed between the individual light-emitting diode chips 3, said separating elements imparting a fixed distance between the connection carrier 2 and the optical body 6 disposed downstream of the light-emitting diodes. Furthermore, the separating elements 7 can be embodied as radiation-reflecting or radiation-absorbent, such that they also serve for optical decoupling between adjacent light-emitting diode chips 3.

The display device furthermore comprises a contact layer 4, which is arranged at that side of the light-emitting diode chips 3 which faces away from the connection carrier 2. In the present case, the contact layer 4 is embodied as radiation-transmissive and electrically conductive. It can be formed, for example, with a transparent conductive oxide such as ITO. By way of example, the contact layer 4 serves as common cathode or common anode for all the light-emitting diode chips 3 of the display device or for all the light-emitting diode chips 3 of part of the display device.

The optical body 6 can be situated in direct contact with the contact layer 4, which optical body can be formed in the present case for example with a radiation-transmissive, in particular transparent, material such as glass. In this case, it is also possible for the material to be pellucid. On account of the, for example, reflection and refraction effects at the interface of the optical body 6, the electromagnetic radiation 5 passing through is expanded to the size of the individual pixels 1. Furthermore, it is possible for scattering effects in the volume of the optical body 6 to lead to expansion of the electromagnetic radiation 5 passing through.

FIG. 1 therefore describes a display device in which the light-emitting diode chips 3 act directly as imaging elements of the display device. The light-emitting diode chips 3 are inorganic light-emitting diode chips formed, for example, with a III-V semiconductor material. The light-emitting diode chips 3 can comprise a conversion layer suitable for the so-called "down-conversion" of electromagnetic radiation passing through. Said conversion layer can also contain an organic material. The light-emitting diode chips 3 are for example free of a growth substrate and/or a carrier substrate. That is to say that the light-emitting diode chips 3 then substantially consist of epitaxially grown material.

Figure 2:
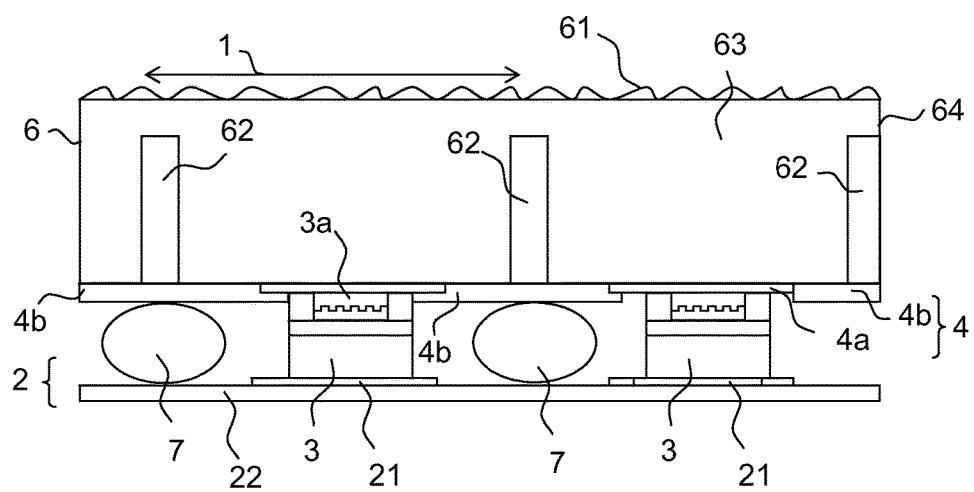

A further exemplary embodiment of a display device described here is explained in greater detail in conjunction with FIG. 2. In this exemplary embodiment, the contact layer 4 comprises radiation-reflecting regions 4b and radiation-transmissive regions 4a. The radiation-transmissive regions 4a can be formed, for example, with a transparent conductive oxide. The radiation-reflecting regions 4b are formed, for example, with a reflective metal such as silver or aluminum. The radiation-reflecting regions 4b support an optical separation between the individual light-emitting diode chips 3 and improve the transverse conductivity of the contact layer 4. In the present case, the contact layer 4 is in electrical contact with the light-emitting diode chips 3 only in edge regions thereof. In the central region of the light-emitting diode chips 3, the contact layer 4 runs at a distance from the radiation exit area 3a.

Furthermore, in the exemplary embodiment as illustrated in FIG. 2, the display device comprises an optical body 6 comprising separating structures 62, which optically decouple adjacent imaging elements 1 from one another. By way of example, the separating structures are embodied as cutouts in a main body 64 of the optical body 6 which are filled with a diffusely reflective material such as titanium dioxide, for example. In the present case, the separating structures 62 do not extend through the entire main body 64, but rather for example at most over a length of ⅘ of the main body 64. In this way, individual pixels are not sharply optically separated from one another directly at the radiation exit area of the optical body 6 facing away from the light-emitting diode chips 3. In this way, no separations, such as dark bars, for instance, between adjacent pixels are discernible to the viewer.

The optical body 6 comprises a main body 64, into which scattering structures 63 are introduced. The scattering structures 63 are suitable for scattering electromagnetic radiation generated by the light-emitting diode chips 3 during operation and support an expansion of the radiation to the size of the pixel 1 at that side of the optical body 6 which faces away from the light-emitting diode chips 3. The optical body 6 furthermore comprises coupling-out structures 61, which are embodied for example as roughenings of the main body 64 and increase the probability of electromagnetic radiation emerging from the optical body 6.

In the present case, a plurality of light-emitting diode chips 3 which emit, for example, light of different colors can be present per pixel 1. In this case, the scattering structures 63 support the intermixing of the light prior to emergence from the optical body 6, such that for each pixel 1 mixed light having—over the pixel 1—particularly homogeneous luminance and particularly homogeneous color locus can emerge at the optical body 6.

Figure 3A:
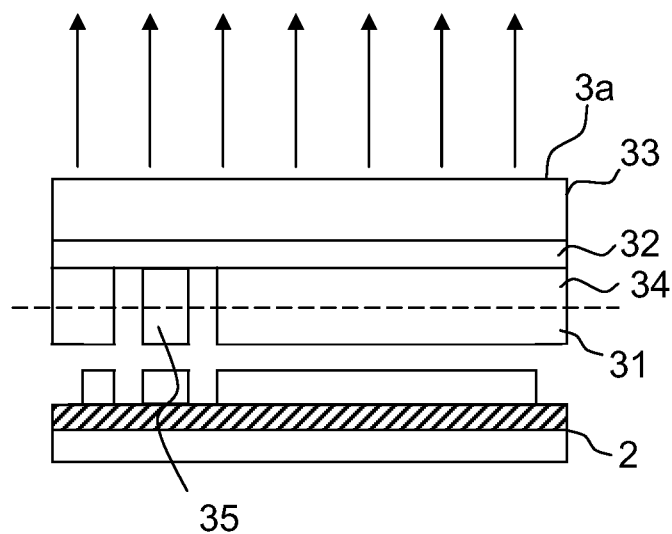
FIGS. 3A and 3B show one possibility for making contact with light-emitting diode chips of display devices described here on the basis of schematic illustrations.
Figure 3B:
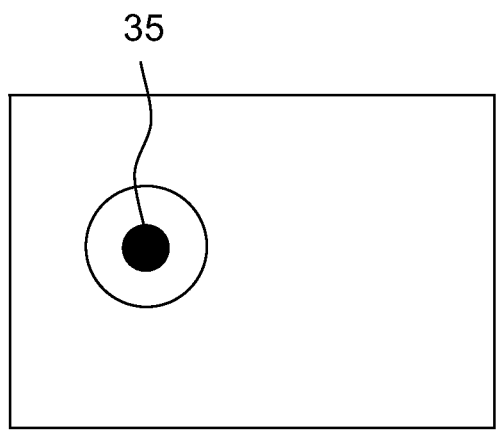

A method for making contact with the light-emitting diode chips 3 is described in conjunction with the schematic illustrations in FIGS. 3A and 3B, this method being an alternative to the use of the contact layer 4 described in conjunction with FIGS. 1 and 2. In this exemplary embodiment of the display device, in contrast to the exemplary embodiments in FIGS. 1 and 2, the p-type side and the n-type side of the light-emitting diode chip 3 can be contact-connected from the side of the connection carrier 2. The light-emitting diode chip 3 comprises an n-conducting region 31, a p-conducting region 32 and an active region 34 provided for generating radiation, said active region being arranged between the two regions. The p-conducting region 32 can be contact-connected via a plated-through hole in the n-conducting region 31 in the region of the p-type contact region 35. In this case, the plated-through hole is surrounded on all sides by the n-conducting region 32 in places in a lateral direction.

In this way, it is possible to dispense with the at least partly radiation-absorbent contact layer 4 at the radiation exit area 3a of the light-emitting diode chip 3. In this case, it is optionally possible for a carrier 33, either a growth substrate or a radiation-transmissive carrier applied subsequently, to be present, through which the electromagnetic radiation 5 leaves the light-emitting diode chip 3.

Overall, a display device wherein light-emitting diode chips as imaging elements can be operated directly by active matrix driving is described in the present case. The display device is distinguished, inter alia, by high contrast values and a small thickness.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. A display device comprising:
a multiplicity of pixels;
a connection carrier comprising a multiplicity of switches;
a multiplicity of inorganic light-emitting diode chips, each pixel containing at least one of the light-emitting diode chips;
a contact layer electrically conductively connecting at least two light-emitting diode chips to one another; and
an optical body disposed downstream of and proximate to at least a portion of the light-emitting diode chips, wherein each light-emitting diode chip is mechanically fixed and electrically connected to the connection carrier, wherein each switch is designed to drive at least one light-emitting diode chip or each switch is assigned one-to-one to a light-emitting diode chip, wherein the light-emitting diode chips are imaging elements of the display device, wherein electromagnetic radiation generated by the light-emitting diode chips during operation at least partly passes through the optical body, wherein the electromagnetic radiation is optically expanded upon passing through the optical body, and wherein the contact layer at least in places directly adjoins the light-emitting diode chips and the optical body, the contact layer electrically conductively connecting the light-emitting diode chips to one another.

2. The display device according to claim 1,
wherein radiation passage areas are formed at a side of the light-emitting diode chips which faces away from the connection carrier,
wherein the contact layer is embodied in a radiation-transmissive fashion in places,
wherein the contact layer is formed in places with a material that is reflective to electromagnetic radiation generated by the light-emitting diode chips during operation, wherein the electromagnetic radiation generated by the light-emitting diode chips during operation at least partly passes through the optical body, wherein the optical body comprises radiation-nontransmissive separating structures, which optically separate adjacent pixels from one another, wherein the separating structures extend from a side of a main body of the optical body which faces the light-emitting diode chips to a side of the main body which faces away from the light-emitting diode chips, the separating structures do not completely extend through the main body, and wherein the separating structures are formed by cutouts in the main body of the optical body which are filled with at least one of $TiO_2$ and $Al_2O_3$.

3. The display device according to claim 1, wherein the contact layer is embodied in a radiation-transmissive fashion at least in places, and wherein the contact layer covers at least in places radiation passage areas of the light-emitting diode chips electrically conductively connected to one another by the contact layer.

4. The display device according to claim 3, wherein the radiation passage areas are formed at a side of the light-emitting diode chips which faces away from the connection carrier.

5. The display device according to claim 1, wherein the contact layer is embodied in a radiation-transmissive fashion at least in places, and wherein the contact layer is formed at least in places with a material that is reflective to electromagnetic radiation generated by the light-emitting diode chips during operation.

6. The display device according to claim 1, wherein the contact layer is formed in places with a transparent conductive oxide.

7. The display device according to claim 1, wherein the contact layer is formed in places with a reflective metal.

8. The display device according to claim 1, wherein the optical body comprises radiation-nontransmissive separating structures that optically separate adjacent pixels from one another.

9. The display device according to claim 8, wherein the optical body comprises scattering structures for scattering the electromagnetic radiation passing through, and wherein the separating structures are formed by diffusely reflective regions.

10. The display device according to claim 8, wherein the separating structures are formed by cutouts in a main body of the optical body which are filled with at least one of $TiO_2$ and $Al_2O_3$.

11. The display device according to claim 8, wherein the separating structures extend from a side of a main body of the optical body which faces the light-emitting diode chips to a side of the main body which faces away from the light-emitting diode chips, the separating structures do not completely extend through the main body.

12. The display device according to claim 1, wherein the optical body comprises scattering structures for scattering the electromagnetic radiation passing through.

13. The display device according to claim 1, wherein a p-type side and an n-type side of each of the light-emitting diode chips are directly connected from a side of the connection carrier, wherein each light-emitting diode chip comprises an n-conducting region, a p-conducting region and an active region provided for generating radiation, the active region being arranged between the two regions, and wherein the p-conducting region is contact-connected via at least one plated-through hole in the n-conducting region.

14. The display device according to claim 1, wherein each switch is designed to drive at least one light-emitting diode chip.

15. The display device according to claim 14, wherein each switch is assigned one-to-one to a light-emitting diode chip.

16. The display device according to claim 1, wherein each switch is assigned one-to-one to a light-emitting diode chip.

17. A display device comprising:

a multiplicity of pixels;

a connection carrier comprising a main body and a multiplicity of switches; and a multiplicity of inorganic light-emitting diode chips, wherein each light-emitting diode chip is mechanically fixed and electrically connected to the connection carrier, wherein each switch is interposed between and proximate to a light-emitting diode chip and the main body of the connection carrier, wherein each switch is designed to drive at least one light-emitting diode chip or each switch is assigned one-to-one to a light-emitting diode chip, the light-emitting diode chips being individually energized by the switches, wherein each pixel comprises at least one light-emitting diode chip, wherein the light-emitting diode chips are imaging elements, and wherein the pixels of the display device are configured to generate and display an image.

* * * * *